TUNER AND RANGE SWITCH

Filed Jan. 24, 1956 2 Sheets-Sheet 1

Inventors:
Ernst Klettke & Gerhard Engelmann
By [signature]
Patent Agent

Jan. 6, 1959 E. KLETTKE ET AL 2,867,765

TUNER AND RANGE SWITCH

Filed Jan. 24, 1956 2 Sheets-Sheet 2

Inventors:
Ernst Klettke & Gerhard Engelmann
By [signature]
Patent Agent

United States Patent Office 2,867,765

Patented Jan. 6, 1959

2,867,765

TUNER AND RANGE SWITCH

Ernst Klettke and Gerhard Engelmann, Hannover, Germany, assignors to Telefunken G. m. b. H., Berlin, Germany Application January 24, 1956, Serial No. 561,121

Claims priority, application Germany January 29, 1955

7 Claims. (Cl. 323—74)

This invention relates to a device for tuning oscillatory or resonant circuits by means of movable-core coils, particularly adapted to tune channels in television receivers. In television receivers, channel switches are frequently used in which a turret tuner is provided, these turret tuners having a coil set for each channel which can be selectively inserted in the circuit. Such channel switches result in considerable expense if the receivers are designed for a larger number of television channels, as required in today's television receivers.

It is an object of the present invention to provide a tuning device employing movable-core coils in television receivers and to provide stops or detents in combination with continuously variable tuning means. In such case, it is necessary to fully cover several tuning ranges, for example, band I and band II.

It is another object of the invention to provide several high frequency coils which are assigned to different wave ranges, whereby the core for one wave range is adapted to enter the coil assigned to it, when the core for another wave range has just completed its tuning displacement in the latter coil.

It is possible to provide such a tuning device with stop or detent positions so that all of the channels of two wave ranges can be obtained with one or more revolutions of the tuning knob. For the higher frequency wave range, the channel frequencies on the dial are closer together than in the lower frequency wave range, so that the detent positions in the two wave ranges must be mechanically differently spaced, in spite of the uniform frequency separation of the transmitter channels, i. e., the tuning knob has to be turned through a different angle when switching over from one transmitting channel to the next in the one wave range than in the other wave range. Equal distances between the detent positions could be obtained by suitably shaped cams. However, a considerable expense would be involved in such construction.

It is, therefore, a further object of the invention to assign to each pair of coils a tuning core and to mechanically interconnect the two tuning cores, whereby the coil for the wave range of shorter wave length is made longer than the other coil and the ratio of diameter of that tuning core and the associated coil diameter is much smaller, or else, the materials of the respective cores are different to such an extent that the frequency changes for a given rotation of the tuning knob in the two ranges will be exactly or at least approximately equal.

The device according to the present invention is also suited to continuous tuning and is adapted to be used as channel switch in television receivers in combination with detent means. A detent position can be provided for each receiving channel by mounting a notched disc on the drive shaft for the coarse adjustment, whereby a detent cooperating with this disc is adapted to engage the notches thereof.

It is a still further object of the present invention to provide a device which has the advantage of occupying only a small space and permitting short electrical conductors in case of a plurality of tuned receiver stages. Thus, it is possible to provide coils wherein those corresponding to each particular receiver stage of one wave range are wound on a common coil form axially adjacent to one another and to provide the coils corresponding to the other wave range on a second coil form axially aligned with one another. The two coil forms are then arranged side by side and parallel with respect to each other. A range switching rod is arranged adjacent to the coil forms parallel with respect thereto and so close to them, that short electrical connections between the coils, tubes and switch terminals are obtained.

It is a further object of the invention to provide in such channel switches with detent positions a fine adjustment means for each receiving channel without use of an additional rotary condenser which would increase the minmum capacity of the oscillatory circuit.

It is a still further object of the invention to provide for this purpose a detent pawl which is pressed against the notched disc by means of a spring, the pawl being attached to a yoke which may be displaced in a circumferential direction with respect to the disc for the purpose of providing a fine adjustment.

These and other important objects and advantageous features of the present invention will be apparent from the following detailed description and drawings, appended thereto, wherein merely for the purpose of disclosure non-limitative embodiments of the invention are set forth.

In the drawings:

Figures 1*a*, 1*b*, 1*c* and 1*d* show schematically the principle of a tuning system according to the invention;

Figures 1, 2:
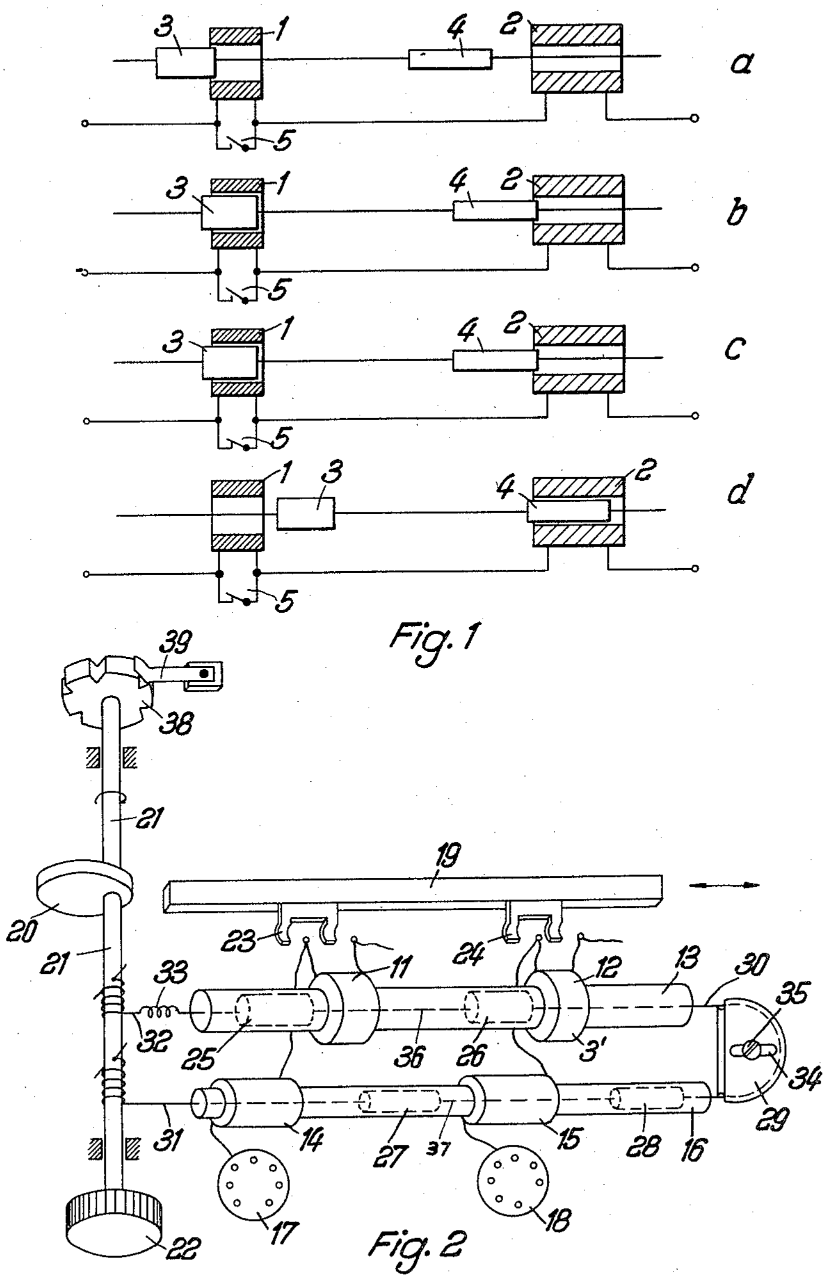
Figure 2 shows a plan view of a practical embodiment of the invention.

In Figs. 1*a*–1*d*, two coils 1 and 2 are mounted adjacent each other in axial alignment, these coils being connected in series. The coils correspond to two wave ranges in a receiver, for example, to two television bands I and II, the inductances of the coils being variable by means of two tuning cores 3 and 4, respectively. These cores may be made, for example, of a non-magnetic, electrically conductive material, such as aluminum, and are disposed adjacent one another, and are mechanically interconnected by means of a cable, so that, during the tuning operation, first the one and then the other tuning core passes through the coil assigned to it. During this operation, the inductance of the corresponding coil decreases with increasing penetration of its core.

Figures 1*a* and 1*b* show the initial and end positions, respectively, for the first wave range, while Figures 1*c* and 1*d* illustrate, respectively, the same positions for the second wave range.

To obtain the same frequency change in each of the two wave ranges with the same displacements of the tuning cores, the coils are designed in such a manner that the coil 2 for the wave range of shorter waves, for example, band II, has a greater length than the coil 1 for the wave range of longer waves, for example, band I. It is usually necessary to provide the ratio of the diameter of the tuning core to the diameter of the coil for wave range of shorter waves smaller than for the wave range of longer waves. In this case, the winding of the coils of the wave range of shorter waves can be made of conducting tape to obtain a linear coupling between coil and tuning core.

Assuming the tuning knob is first continuously turned, the two tuning cores 3 and 4 will be displaced through the same distance in the direction of the coils 1 and 2. When the first wave range, for example, of longer waves, is to be tuned, the two coils are inserted in the circuit in series, whereby the relatively small inductance of the coil 2 is negligible with respect to the large inductance of the coil 1. When the tuning core 4 enters the coil 2, as shown in Figure 1*b*, the coil 1, of larger inductance, will be automatically shortened by a switch 5 (see Fig. 1*c*), so that only the inductance of the coil 2 remains active, until the final position, shown in Figure 1*d*, is reached. The second wave range of shorter waves is tuned by the coil 2.

In this system, the penetrating depths of the cores into the coils is selected in such a manner, that the useful inductance change takes place only in the linear range of the tuning characteristic which, over its entire length, has the shape of the letter S.

In the practical embodiment of the invention, illustrated in Figure 2, the coils are simultaneously tuned by several oscillatory circuits connected to different receiver stages. In this illustration, the coils 11 and 12 of the one wave range belonging to the various receiver stages are mounted on a common coil form 13 and the corresponding coils 14 and 15 of the other wave range are mounted on a different coil form 16, and these coils are aligned on the same axis. The two coil forms 13 and 16 are disposed parallel with respect to one another and so close to each other, that the electric connections between the coils and the associated tubes 17 and 18 of the receiver stages belonging thereto are short. A switch bar 19 is arranged adjacent the coil form 13 to short-circuit the coils 11 and 12 when passing over the second wave range, said switch bar 19 being adapted to be operated by means of a cam 20, which is mounted on a shaft 21, with the aid of a tuning knob 22 during channel switching.

The contacts 23 and 24 of this switching bar short-circuit the coils 11 and 12 as soon as the first wave range has been passed over by means of the tuning cores 25 and 26 in the coils 11 and 12, and the tuning cores 27 and 28 are just entering the coils 14 and 15, respectively. The tuning cores 25, 26 and 27, 28 are mechanically interconnected by means of a cable 30 passing over a cable-reversing, grooved block 29, the ends of this cable being attached to the shaft 21 in such a manner, that the end 31 of the cable is wound onto the shaft when the end 32 of this cable is being unwound from this shaft, or vice versa. A spring 33 is inserted in the cable to maintain the necessary mechanical tension between the tuning cores. By displacing the block 29 in the direction of movement of the cores, it is possible to displace the tuning cores of the one coil form relative to the tuning cores of the other coil form and, thereby, adjust the transition from the one to the other wave range. For this purpose, a slot 34 is provided in the block 29 at which the latter is fixed to a support by means of a bolt or screw 35.

Small changes in the length of the cable result in changes in the distance between the tuning cores and, thereby, impair the simultaneous adjustment of the two receiver stages. Therefore, the tuning cores 25, 26 and 27, 28 may be interconnected by means of solid insulating bars 36 and 37, respectively, while cable means are only provided around the block 29 and at the cable ends connected to the shaft 21. For adjusting the coils 11, 12 and 14, 15, the tuning cores 25, 26 and 27, 28 may be adjustably mounted on the insulating bars 36 and 37, respectively. At certain given distances between the coils 11, 12 and 14, 15 on the coil forms 13 and 16, respectively, it is possible to secure the tuning cores to the insulating bars at the proper distances by means of a templet and, thereby, facilitate the mass production of such apparatus.

The switch bar 19 may be provided above, between or below the coil forms 13 and 16, rather than being disposed adjacent these coil forms, as shown in Figure 2.

It is also possible to tune additional receiver stages in accordance with the invention by arranging on each coil form more than two coils, namely, such number of coils, which correspond to the number of oscillatory circuits to be tuned. By providing several cable-reversing blocks, such tuning system may be enlarged to tune more than two wave ranges.

In television systems, the available wave ranges are divided into channels having the same frequency separations. Therefore, one detent position is assigned for each channel in the receiver. For this purpose, a notched disc 38 is mounted on the shaft 21, said disc stopping the displacement of the tuning cores at equal frequency separations by means of the detent pawl and spring 39. The cam 20 is designed in such a manner that the switching over from one wave range to the other, by means of the switch bar 19, takes place between two detent positions.

Figure 3:
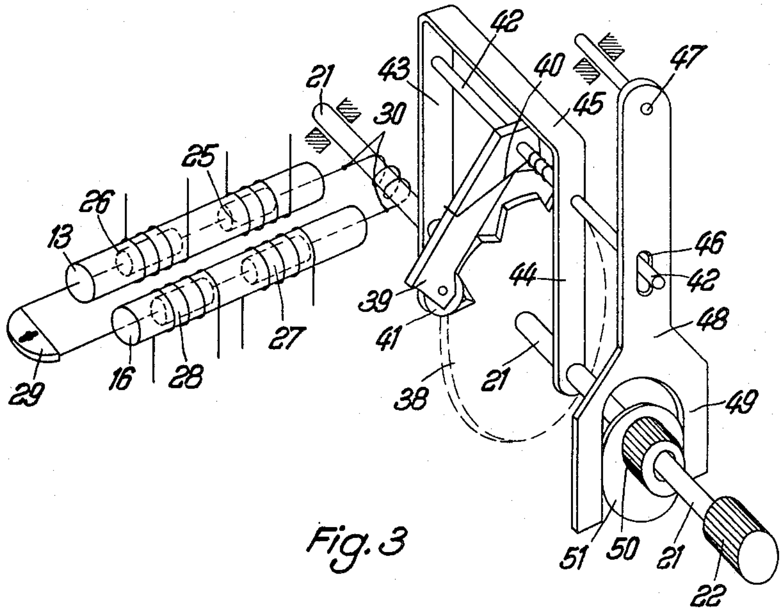
Figure 3 is a perspective view of a modified embodiment of the invention.

It will be shown in the embodiment of Figure 3 of this invention how the notched disc assembly can be provided with a fine adjusting means, as required for fine adjustment of television receivers. The device in Figure 3 is similar to that in Figure 2 and the same reference numbers are used for like elements. A notched disc 38 is mounted on the drive shaft 21, the number of notches of this disc corresponding with the number of receiving channels to be tuned. A pawl 39, biased by a spring 40, engages in the notches of this disc 38, the front end of said pawl carrying a roller 41. The other end of the pawl 39 is provided with an opening through which a shaft 42 is passed and about which this pawl is pivoted. The shaft 42 is journalled in legs 43 and 44 of a yoke 45, the ends of said legs having openings to receive the drive shaft 21, about which the yoke 45 is adapted to turn. One of the ends of the shaft 42 is extended so far beyond the frame 45 that it is displaceably received in a perpendicular slot 46 of a lever 48, the latter being stationarily mounted on its one end 47, so as to permit the lever 48 to be displaced through small angles. The lever 48 has a bifurcated free end 49 engaging an eccentric cam 51 secured to the fine adjustment knob 50. The fine adjustment knob 50 is coaxially arranged on the drive shaft, so that it can be freely turned. It is also possible to provide it on a separate shaft.

By turning the coarse adjustment knob 22, the notch, corresponding to the desired receiving channel and, thus, to a certain reproducible position of the tuning cores, can be adjusted. During this coarse adjusting operation, the shaft 42, in cooperation with the yoke 45, and the perpendicular guiding slot 46 of the lever 48 act as fixed bearing of the pawl 39. When the fine adjustment knob 50 is rotated, the eccentric cam 51 is turned and, thereby, the lever 48 is rocked through a correspondingly small angle toward the right or the left. As a result of this, the shaft 42 and the yoke 45 with the pawl 39 are turned concentrically with respect to the periphery of the notched disc, i. e., in a circle around the driving shaft. To avoid back-lash between the eccentric cam 51 and the bifurcated end 49 of the lever 48, the legs of this end 49 may be made resilient.

The application of the device according to Figure 3 is not limited to systems in which movable-core-tuned coils are used. This device may also be used in cases in which the driving shaft turns, for example, a rotary condenser.

Although, in accordance with the provisions of the patent statutes, this invention is described as embodied in concrete forms and the principle of the invention has been explained together with the best modes in which it is now contemplated applying that principle, it will be understood that the elements, circuits and combinations, shown and described, are merely illustrative and that the invention is not limited thereto, since alterations and modifications readily suggest themselves to persons skilled in the art without departing from the true spirit of the invention or from the scope of the annexed claims.

We claim:

1. In a resonant circuit, a tuning device for selecting one of a plurality of distinct frequency channels, the channels being distributed over at least two separate ranges of channel frequencies, comprising a set of coils comprising at least one coil for each range and capable of tuning all of the channels in each frequency range; a separate tuning core axially aligned with each coil, core mounting means attaching said cores together in predetermined relationship and passing through each coil, the spacing of the coils along the mounting means being fixed and selected so that each core traverses the tuning range of the coil with which it is associated at a time exclusive of the tuning time of the other cores; mechanical actuating means coupled to said core mounting means to reciprocate the latter; and selecting means controlled by said mechanical means and successively selecting the coils relating to one range as the cores associated with the selected coils are traversing that tuning range, the linear distribution of the respective tuning coils of each range and the ratios of diameter of each coil to its associated core being varied from range to range such that the amount of movement of said mechanical means from resonance at one channel to resonance at any adjacent channel in one range is the same as that in each other range.

2. A device as set forth in claim 1, wherein two or more separate resonant circuits are to be tuned, said device comprising a separate set of coils for each resonant circuit to be tuned, the coils of all of the sets being arranged along the same core mounting means; and a core for each of the coils, said cores all being connected together in series by said core mounting means.

3. A device as set forth in claim 1, wherein the coils are mounted side by side on several tubular coil forms having bores through which the cores pass, the coil forms being oriented and supported in parallel relationship; said mechanical means comprising a shaft rotatably journalled across the open ends of the coil forms; and said core mounting means comprising a cable passing axially through the said coil forms and carrying the cores attached to the cable in series; cable direction reversing means between adjacent coil forms, and the ends of the cable being fixed to and wrapped in opposite directions around said shaft, whereby rotation of the shaft causes reciprocation of the cores.

4. A device as set forth in claim 3, wherein a pair of parallel coil forms is employed, and said cable reversing means is adjustably supported to permit axial adjustment of its distance from the adjacent ends of the forms; and a tension spring in one leg of the cable near its end, whereby adjustment of the position of the reversing means alters the length of the tension spring to adjust the position of the cores with respect to the coils located around the leg of the cable containing the spring.

5. A device as set forth in claim 3, wherein the portions of the core-mounting means which lie entirely within a coil form comprise rigid bars on which the cores are mounted in mutually adjustable relation.

6. In a device as set forth in claim 3, all of said frequency ranges being tunable by continuous rotation of said shaft in one direction, and said selecting means comprising a cam fixed to said shaft and rotatable therewith; and selector switch means connected with said coils, said cam engaging said selector switch means to actuate the latter at the appropriate angle of rotation of the shaft.

7. In a device as set forth in claim 3, detent means whereby rotation of the shaft from stop to stop will tune the coils to preselected channels, comprising a disc attached to said shaft and having notches spaced around its periphery to correspond with said channels; a pawl yieldably urged against the disc to index in said notches as the shaft and disc are rotated, said pawl being mounted in a yoke which is journalled on said shaft, the yoke and pawl being capable of circumferential motion about the axis of the shaft; a sleeve journalled on said shaft and having an eccentric outer periphery; a pivotally mounted lever arm bifurcated at one end to surround said eccentric and be rocked about said pivot when the eccentric is rotated; and a linkage between the arm and the yoke whereby rocking of the arm causes circumferential motion of the yoke, pawl, disc and shaft.

References Cited in the file of this patent

UNITED STATES PATENTS

| | | |
|---|---|---|
| 2,226,822 | Kirk et al. | Dec. 31, 1940 |
| 2,276,617 | Kreienfeld | Mar. 17, 1942 |
| 2,374,824 | Leishman | May 1, 1945 |
| 2,580,895 | Tar | Jan. 1, 1952 |
| 2,729,746 | Pan | Jan. 3, 1956 |

FOREIGN PATENTS

| | | |
|---|---|---|
| 280,990 | Switzerland | June 3, 1952 |